United States Patent
Hashemi et al.

(10) Patent No.: US 10,937,898 B2
(45) Date of Patent: Mar. 2, 2021

(54) LATERAL BIPOLAR JUNCTION TRANSISTOR WITH DUAL BASE REGION

(71) Applicant: International Business Machines Corporation, Armonk, NY (US)

(72) Inventors: Pouya Hashemi, Purchase, NY (US); Bahman Hekmatshoartabari, White Plains, NY (US); Alexander Reznicek, Troy, NY (US); Karthik Balakrishnan, Scarsdale, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 16/540,831

(22) Filed: Aug. 14, 2019

(65) Prior Publication Data
US 2019/0371923 A1    Dec. 5, 2019

Related U.S. Application Data (62) Division of application No. 15/828,152, filed on Nov. 30, 2017, now Pat. No. 10,734,505.

(51) Int. Cl.
| | |
|---|---|
| *H01L 29/10* | (2006.01) |
| *H01L 29/737* | (2006.01) |
| *H01L 29/205* | (2006.01) |
| *H01L 29/20* | (2006.01) |
| *H01L 21/308* | (2006.01) |
| *H01L 21/265* | (2006.01) |
| *H01L 21/266* | (2006.01) |

(Continued)

(52) U.S. Cl.
CPC .......... *H01L 29/737* (2013.01); *H01L 21/266* (2013.01); *H01L 21/26546* (2013.01); *H01L 21/26586* (2013.01); *H01L 21/308* (2013.01); *H01L 21/30612* (2013.01); *H01L 29/0808* (2013.01); *H01L 29/0821* (2013.01); *H01L 29/1008* (2013.01); *H01L 29/2003* (2013.01); *H01L 29/205* (2013.01); *H01L 29/6625* (2013.01); *H01L 29/66318* (2013.01); *H01L 29/735* (2013.01)

(58) Field of Classification Search
CPC ................................. H01L 29/66318
See application file for complete search history.

(56) References Cited

U.S. PATENT DOCUMENTS

| | | |
|---|---|---|
| 4,316,967 A | 2/1982 | Hergenrother et al. |
| 8,026,146 B2 | 9/2011 | Donkers et al. |

(Continued)

FOREIGN PATENT DOCUMENTS

JP    2001331591 A    11/2001

OTHER PUBLICATIONS

IBM, "List of IBM Patents or Patent Applications Treated as Related," for U.S. Appl. No. 16/540,831, filed Aug. 14, 2019.

*Primary Examiner* — Thao P Le
(74) *Attorney, Agent, or Firm* — Patterson + Sheridan, LLP (57) ABSTRACT

A structure and method of forming a lateral bipolar junction transistor (LBJT) that includes: a first base layer, a second base layer over the first base layer, and an emitter region and collector region present on opposing sides of the first base layer, where the first base layer has a wider-band gap than the second base layer, and where the first base layer includes a III-V semiconductor material.

20 Claims, 9 Drawing Sheets

(51) Int. Cl.
*H01L 21/306* (2006.01)
*H01L 29/66* (2006.01)
*H01L 29/735* (2006.01)
*H01L 29/08* (2006.01)

(56) References Cited

U.S. PATENT DOCUMENTS

| | | |
|---|---|---|
| 8,557,670 B1 | 10/2013 | Cai et al. |
| 8,558,282 B1 | 10/2013 | Cai et al. |
| 9,159,816 B2 | 10/2015 | Harame et al. |
| 9,369,125 B2 | 6/2016 | Alexander et al. |
| 9,673,307 B1* | 6/2017 | Chan .................. H01L 29/6625 |
| 10,483,368 B1* | 11/2019 | Hashemi ............ H01L 29/0808 |
| 2002/0123134 A1 | 9/2002 | Huang et al. |
| 2007/0172583 A1 | 7/2007 | Lin et al. |
| 2010/0210745 A1 | 8/2010 | McDaniel et al. |
| 2011/0028815 A1 | 2/2011 | Simpson et al. |
| 2012/0313216 A1* | 12/2012 | Cai ....................... H01L 27/082 |
| | | 257/526 |
| 2013/0313552 A1* | 11/2013 | Hekmatshoar-Tabari .................. |
| | | H01L 21/02592 |
| | | 257/51 |
| 2015/0011073 A1 | 1/2015 | Lei et al. |
| 2015/0065020 A1 | 3/2015 | Roy et al. |
| 2015/0207023 A1 | 7/2015 | Nielson et al. |
| 2017/0038510 A1 | 2/2017 | Sudeji |
| 2017/0294525 A1* | 10/2017 | Hashemi ............ H01L 29/1008 |
| 2018/0019330 A1* | 1/2018 | Balakrishnan ...... H01L 21/0242 |
| 2019/0157433 A1* | 5/2019 | Hashemi ............ H01L 29/0649 |
| 2019/0165150 A1* | 5/2019 | Hashemi ........... H01L 21/26586 |

* cited by examiner

LATERAL BIPOLAR JUNCTION TRANSISTOR WITH DUAL BASE REGION

CROSS-REFERENCE TO RELATED APPLICATIONS

This application is a divisional of co-pending U.S. patent application Ser. No. 15/828,152, filed Nov. 30, 2017. The aforementioned related patent application is herein incorporated by reference in its entirety.

BACKGROUND

Technical Field

The present disclosure relates to a bipolar junction transistor (BJT) structure, and more particularly to lateral bipolar junction transistors.

Description of the Related Art

Heterojunction bipolar junction transistors (HBJTs) known in the art include a heterojunction, i.e., a junction of two semiconductor materials having different band gaps, that coincide with a p-n junction between the base and the emitter. The wider band gap of the emitter relative to the band gap of the base in an HBJT increases the current gain relative to a bipolar junction transistor employing a same semiconductor material across the base and the emitter and having similar physical dimensions and doping profiles for the base and emitter.

SUMMARY

One aspect of the present disclosure is a method for forming a lateral bipolar junction transistor (LBJT) device is provided. The method includes the steps of: providing a III-V insulator substrate that includes an insulator layer and a III-V material layer, epitaxially forming a base material layer over the III-V material layer, forming emitter and collector extension regions on opposing sides of the base material layer using ion implantation; and epitaxially forming an emitter region and collector region in contact with the emitter and collector extension regions, where the III-V material layer has a wider band gap than the base layer.

Another aspect of the present disclosure is a method that includes providing a substrate that comprises an insulator layer and a III-V material layer, forming a base material layer over the III-V material layer, forming emitter and collector extension regions on opposing sides of a second base material layer, and forming an emitter region and a collector region in contact with the emitter and collector extension regions. Moreover, the emitter and collector regions and the emitter and collector extension regions form part of a bipolar junction transistor device These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of certain embodiments with reference to the following figures where.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The term "bipolar junction transistor (BJT)" denotes a semiconductor device formed by two P-N junctions whose function includes amplification of an electric current. Bipolar transistors can be made from three sections of semiconductor material, i.e., alternating p-type and n-type conductivity semiconductor materials, with two resulting P-N junctions. As will be described in greater detail below the BJT devices disclosed herein can be lateral bipolar junction transistors (LBJT). The term "lateral" as used to describe a BJT device denotes that means that the dimension extending from the beginning of the emitter through the base to the collector is horizontally orientated or is parallel with the upper surface of the substrate in which the emitter/base/collector, i.e., NPN or PNP junction, is formed.

The present disclosure provides LBJT, and methods of forming LBJT devices. III-V semiconductor materials are good candidates for LBJTs because they can offer high cut off frequency for both NPN and PNP types. One advantage of III-V devices in relation to other alternatives is that the channel of the LBJT device can be grown epitaxially on a III-V layer that can be semi-insulating, with high resistivity and a wider bandgap. This permits formation of junctions without the need for multiple ion implantation steps, i.e., reducing the channel after spacer placement and tilted ion implantation (the Emitter and Collector regions of the LBJT can be grown from a seed in the bottom of a III-V layer). A disadvantage of "bulk" III-V BJTs can be the leakage of current through the bottom III-V semi-insulating layer, and possible crystal defects formed during epitaxial growth.

In order to remedy the above technical problems, and to establish other technical advantages, certain embodiments of the present specification contemplate an LBJT having a dual material base region formed on a bonded type III-V on insulator substrate.

In certain embodiments, wafer bonding allows bonding any compound semiconductor to a substrate, designing the lattice template desired. Ensuring that the lattice template is well designed and matched, can be especially useful for larger lattice compound semiconductors, often smaller bandgap materials, including type III-V semiconductor materials, such as high indium content type III-V materials. In at least one embodiment of this disclosure, in order to provide for higher transistor gain, a dual base layer stack for the LBJT base is provided, where the bottom base layer repels minority carriers formed due to interface states from the bonded insulator interface, thus reducing minority carrier recombination. Specifically, in certain embodiments of the present specification, a dual material stack for the LBJT is proposed, where the base has a thin layer of a wide bandgap type III-V or group IV semiconductor material at the bottom, followed by another base layer on top that includes III-V material or type IV semiconductor material. In one embodiment, both base materials are lattice matched, so no defects are introduced. As stated, the wide bandgap portion at the bottom of the base repels minority carriers from the bonded insulator interface, thus reducing minority carrier recombination (which contributes to the base current), and therefore provides a higher transistor gain (which is defined as the collector current divided by the base current).

As will be described in further detail below, in some embodiments of the methods and structures disclosed herein, a type III-V substrate is provided, which can include a silicon wafer, an insulator layer, and a type III-V semiconductor layer. The type III-V semiconductor layer forms the wider-band gap portion of the dual base region and can be used to form the first layer of the dual layer base region. Thereafter, a second semiconductor layer including type III-V or type IV semiconductor material is epitaxially grown over the first semiconductor layer, where the second semiconductor layer is lattice matched to the first type III-V semiconductor layer and has a narrower band-gap associated therewith. The second semiconductor layer forms the second base layer, and thus, a dual base region with a first base layer that includes a type III-V and a second base layer that includes a type III-V or type IV semiconductor material is formed. Thereafter, following formation of an extrinsic base layer and spacers, junctions can be formed using angled ion implantation and epitaxial growth. The methods and structures of the present disclosure are now described with greater detail with reference to FIGS. 1-9.

Figure 1:
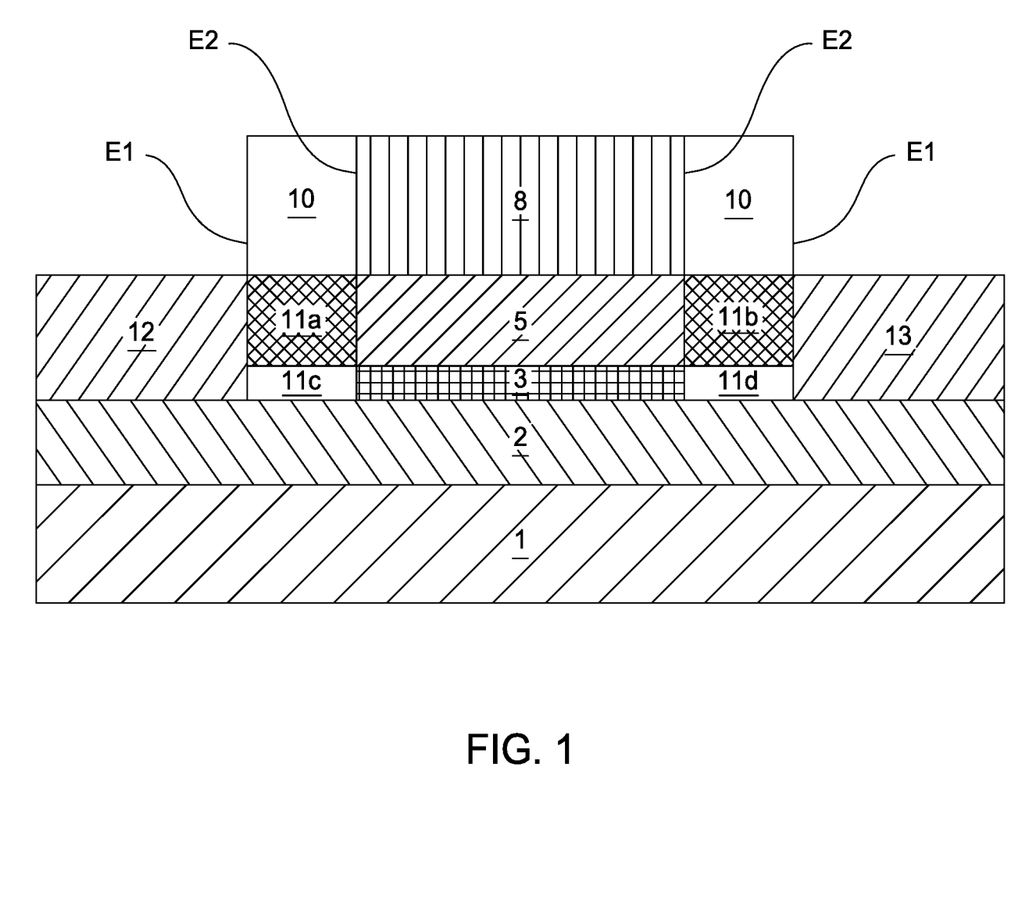
FIG. 1 is view of an LBJT device that includes a dual base region and emitter and collector regions that are on a semiconductor substrate, in accordance with one embodiment of the present disclosure.

FIG. 1 depicts an embodiment of an LBJT device that includes a first base layer 3 that is underlying a second base layer 5, which includes a type IV or a type III-V semiconductor material, the emitter region 12, and the collector region 13. The first base layer 3 can be composed of any suitable type III-V material including indium phosphide (InP), indium aluminum arsenide (InAlAs), indium gallium arsenide (InGaAs), gallium arsenide (GaAs), gallium phosphide (GaP), indium antimonide (InSb), indium arsenide (InAs), indium nitride (InN), indium phosphide (InP), aluminum gallium arsenide (AlGaAs), indium gallium phosphide (InGaP), aluminum indium arsenide (AlInAs), aluminum indium antimonide (AlInSb), gallium arsenide nitride (GaAsN), and combinations thereof. The second base layer 5 can be composed of any type III-V or type IV semiconductor material, including but not limited (Ge) germanium, silicon (Si) germanium (Ge), indium phosphide (InP), indium aluminum arsenide (InAlAs), indium gallium arsenide (InGaAs), gallium arsenide (GaAs), gallium phosphide (GaP), indium antimonide (InSb), indium arsenide (InAs), indium nitride (InN), indium phosphide (InP), aluminum gallium arsenide (AlGaAs), indium gallium phosphide (InGaP), aluminum indium arsenide (AlInAs), aluminum indium antimonide (AlInSb), gallium arsenide nitride (GaAsN), and combinations thereof. The selection of materials for each base layer is done such that one base layer has a wider bandgap than the other base layer.

In one embodiment, the first base layer 3 has a wider band gap than the second base layer 5, the first base layer 3 and the second base layer 5 both include type III-V materials, and both the first layer 3 and the second base layer 5 are substantially lattice matched. In one embodiment, the first base layer 3 can be InP where the Bandgap is 1.27 eV, and the second base layer 5 can be InGaAs with a concentration of 53% In and a bandgap of 0.75 eV. In another embodiment, the first base layer 3 includes a type III-V material, the second base layer 5 includes a type IV material, both the first base layer 3 and the second base layer 5 are substantially lattice matched, and the first base layer 3 has a wider band gap than the second base layer 5. In yet another embodiment, the first base layer 3 is GaAs with a bandgap of 1.43 eV and the second base layer 5 is germanium (Ge) with a bandgap of 0.66 eV, e.g., single crystal germanium (c-Ge). It is noted that the above compositions are provided for illustrative purposes only, and are not intended to limit the present disclosure.

The terms "epitaxial growth and/or deposition" and "epitaxially formed" mean the growth of a material, such as a semiconductor or dielectric, on a deposition surface of a semiconductor material, in which the material being grown has the same crystalline characteristics, e.g., crystalline plane orientation, as the semiconductor material of the deposition surface. For example, the first base layer 3 may have the same orientation crystal plane as the second base layer 5. By way of specific example, both the first base layer 3 and the second base layer 5 may have the orientation of a (111) crystal plane. In other embodiments, different planes, such as (110) may be possible.

The term "band gap" refers to the energy difference between the top of the valence band (i.e., EV) and the bottom of the conduction band (i.e., EC). In one embodiment, the band gap difference between the base layers should be between 0.1 eV to 0.2 eV, where the difference is at least twice the thermal energy of 26 meV (at room temperature), e.g. 0.052 meV.

By "substantially lattice matched" it is meant a semiconductor material that has a lattice constant that is from +/−0.5% from the lattice constant of the material that it is matched with, i.e. the lattice constant of the first base layer 3 will be +/−0.5% within range of the lattice constant of the second base layer 5.

The thickness of both the first base layer 3 and second base layer 5 may be selected to function as one or more seed layers for the epitaxial growth of the emitter and collector regions 12, 13. The second base layer 5 may have a thickness ranging from 20 nm to 500 nm and the first base layer 3 may have a thickness of 5 nm to 50 nm, where in one embodiment, the second base layer 5 is thicker than the first base layer 3. It is noted that the above examples are provided for illustrative purposes only, and are not intended to limit the present disclosure.

The first base layer 3 and the second base layer 5 form a dual base active region, which is the region within the LBJT where a sufficient input current triggers a larger current from the emitter 12 to the collector 13 of the transistor when a voltage is applied between the emitter 12 and the collector 13. The role of the dual base region is to function as an amplifier causing an emitter-to-collector current to be much larger than the base current. When the dual base receives an input current, a larger current then flows from the emitter region 12 to the collector region 13. In a BJT, current flows from the emitter region 12 to the collector region 13 and then out from the collector region 13.

The dual base region or active region of the transistor has an opposite polarity, i.e., conductivity type, from the emitter region 12 and the collector region 13. The term "conductivity type" means that a region is either doped to an n-type conductivity or a p-type conductivity. For example, when the first base layer 3 and the second base layer 5 are doped to an n-type conductivity, the emitter region 12 and the collector region 13 are doped to a p-type conductivity, and the transistor is referred to as a PNP bipolar transistor. In another example, when the first base layer 3 and the second base layer 5 is doped to a p-type conductivity, the emitter region 12 and the collector region 13 are doped to an n-type conductivity, and the transistor is referred to as an NPN bipolar transistor.

The first base layer 3 is directly on insulator layer 2. As will be described below, the first base layer 3 is formed from a semiconductor layer that is bonded to the insulator layer 2. Bonding the semiconductor layer, from which the first base layer 3 will be formed, to the insulator layer 2 makes selecting an appropriate lattice template for both the first base layer 3 and the layer epitaxially grown second base layer 5, and it enables epitaxial growth of the semiconductor layer, from which the second base layer 5 will be formed, such that the first base layer 3 and the second base layer 5 are substantially lattice matched, even though a lattice match may not present at the interface of the first base layer 3 and the insulator layer 2. The bonded interface between the first base layer 3 and the insulator layer 2 may be provided by a chemical bond, thermal bond, adhesive bond, or a combination thereof. In some embodiments, the interface between the first base layer 3 and the insulator layer 2 may be characterized by a lattice mismatch. The insulator layer 2 can function as an etch stop layer in the patterning of the first base layer 3 and the second base layer 5.

The extrinsic base layer 8 can be first patterned and etched atop the second base layer 5. Spacers 10 are then formed on the sidewalls of the extrinsic base layer 8. Using the extrinsic base layer 8 and spacers 10 as an etch mask, the material layer that provides the second base layer 5 and the material layer that provides the first base layer 3 is then etched selectively to the underlying insulator layer 2.

This exposes the sidewalls of the first base layer 3 and the second base layer 5 (collectively "dual base region") such that they are substantially aligned with the spacers 10 and extrinsic base region 8 for forming the junctions 11a, 11b, 11c, and 11d. The appropriate n-type or p-type dopant is then ion implanted using angled ion implantation into the exposed sidewalls of the dual base region. For example, the LBJT device that is depicted in FIG. 1 may include junctions, i.e., emitter extension regions 11a and 11c, being present between the emitter region 12 and the dual base region on one side of the device, and the collector extension region 11b and 11d present between the dual base region and the collector region 13 on the opposing side of the device. The dopant concentration in the junctions 11a, 11b, 11c and 11d ranges from $1\times10^{18}$ cm$^{-3}$ to $1\times10^{20}$ cm$^{-3}$.

Because the dopant, i.e., n-type or p-type dopant, is implanted directly into the exposed sidewalls of the first base layer 3 and the second base layer 5 that are aligned with the extrinsic base region 8 and spacers 10, the junctions 11a, 11b, 11c, and 11d can have a uniform dopant concentration, i.e., uniform lateral and vertical dopant gradient. For example, each of the emitter extension region 11a, 11c and the collector extension region 11b, 11d may be substantially aligned with an outer edge E1 of an overlying spacer 10 and does not extend beyond an inner edge E2 of the spacer 10. The emitter extension region 11a, 11c and the collector extension region 11b, 11d may extend from the outer edge E1 towards the dual base region at an abrupt dopant concentration gradient of n-type or p-type dopants of 5 nm per decade or less, e.g., 4 nm per decade or less.

Still referring to FIG. 1, the emitter region 12 and collector region 13 are present on opposing sides of the dual base region. The emitter region 12 and collector region 13 are epitaxially formed semiconductor materials in an epitaxial relationship with the dual base region. As stated above, the term "epitaxial" denotes that a material is formed using an epitaxial growth process. The emitter region 12 and collector region 13 may be composed of a single crystalline in-situ doped III-V material, poly-crystalline III-V material, polycrystalline silicon, polycrystalline germanium, polycrystalline silicon germanium, single crystalline germanium or single crystalline silicon germanium. The material that is selected for the semiconductor material of the emitter region 12 and the collector region 13 may have a larger band gap than both layers of the dual base region (the first base layer 3 and the second base later 5). For example, in some embodiments, to provide that the emitter and collector region 12, 13 have a larger band gap than the dual base region, in addition to any other materials, expressly provided for or implied herein, the emitter and collector region 12, 13 can include AlInGaP (aluminum indium gallium phosphide).

Still referring to FIG. 1, in some embodiments, the emitter and collector regions 12, 13 are laterally grown from the first base layer 3 and/or the second base layer 5, and may be composed of facetted epitaxially grown semiconductor material. By facetted it is meant that the epitaxial growth is preferentially along a specific crystalline plane, such as along the (111) or (110) plane. This may result in a pyramid upper surface geometry. In some embodiments, the epitaxially grown semiconductor material that provides the emitter and collector regions 12, 13 is non-facetted. This typically results in a material layer that does not include the pyramid geometry provided by facetted growth.

Still referring to FIG. 1, the LBJT device may further include an extrinsic base layer 8 that is present atop the second base layer 5. The extrinsic base layer 8 is typically formed of a type III-V material, including a single crystalline type III-V material, silicon or germanium containing semiconductor material, such as silicon, single crystal silicon, polycrystalline silicon, polycrystalline germanium, polycrystalline silicon germanium, single crystal germanium, single crystal silicon germanium, and combinations thereof. The extrinsic base layer 8 is typically doped to a same conductivity type as the dual base region. For example, if the dual base region is doped to an n-type conductivity, the extrinsic base layer 8 is also doped to an n-type conductivity. The dopant concentration of the dopant that dictates the conductivity type of the extrinsic base layer 8 is typically greater than the dopant concentration that dictates the conductivity type of the dual base region. For example, the dopant concentration of the n-type or p-type dopant in the extrinsic base layer 8 may range from $4\times10^{19}$ atoms/cm$^3$ to $6\times10^{21}$ atoms/cm$^3$. In another example, the dopant concentration of the n-type or p-type dopant in the extrinsic base layer 8 may range from $1\times10^{20}$ atoms/cm$^3$ to $1\times10^{21}$ atoms/cm$^3$. The extrinsic base layer 8 is present within the width of the second base layer 5.

Spacers 10 of a dielectric material, such as an oxide, nitride, oxynitride material or low-k dielectric material, are present on the sidewalls of the extrinsic base layer 8. Examples of materials suitable for low-k dielectric spacers 10 include, fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. During fabrication of the structure of FIG. 1, a hard mask (described below) may be present atop the extrinsic base layer 5, and may be composed of an oxide, nitride, or oxynitride material. For example, the hard mask can be composed of silicon nitride.

FIGS. 2-10 depict at least one embodiment of a method for forming the LBJT device(s) depicted in FIG. 1.

Figure 2:
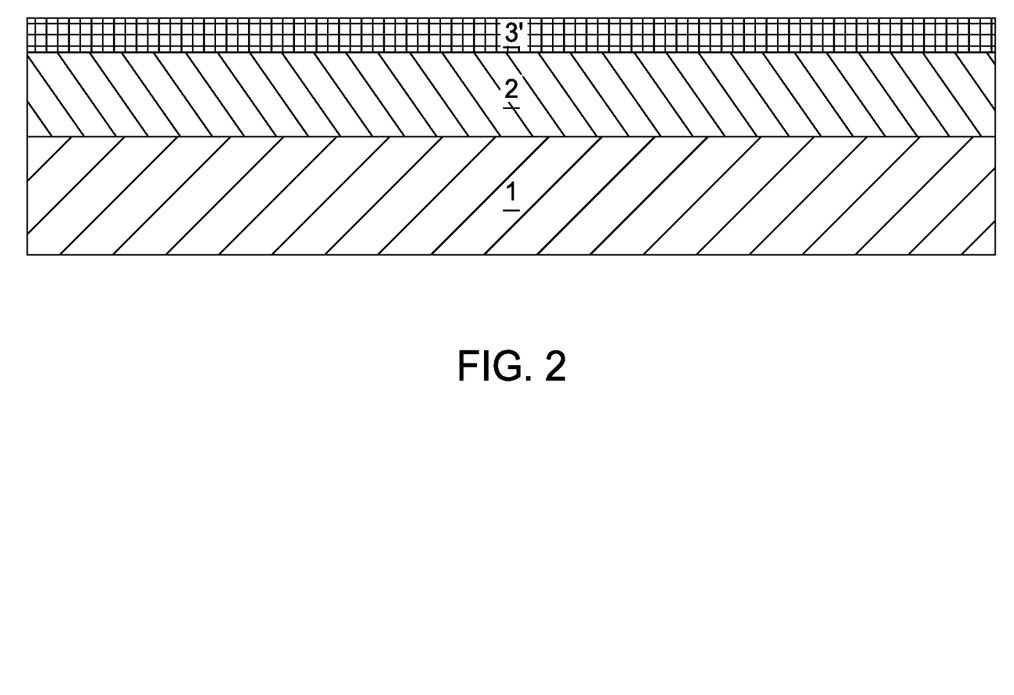
FIG. 2 is a side cross-sectional view depicting one embodiment of a substrate structure that may be used to form an LBJT that includes a material stack of a type III-V semiconductor material for forming a first base layer, a buried oxide or insulator layer and a base supporting substrate, in accordance with one embodiment of the present disclosure.

FIG. 2 depicts one embodiment of a substrate structure that includes a material stack of a type III-V semiconductor material 3', a buried oxide or insulator layer 2, and a supporting substrate 1. As will be described below, semiconductor layer 3, which can be a t germanium containing material layer, a silicon containing material layer, or any suitable type III-V semiconductor material layer, provides the first base layer 3 of the LBJT device, as depicted in FIG. 1.

The LBJT device that is depicted in FIG. 1 may be present on a semiconductor substrate 1 composed of a type III-V semiconductor material or type IV semiconductor material. The semiconductor substrate 1 is typically composed of a single crystalline material. Examples of type IV semiconductor materials for the semiconductor substrate 1 include silicon (Si), germanium (Ge). The semiconductor substrate 1 may also be composed of indium phosphide (InP) or indium phosphide (InP) on silicon (Si). Other III-V semiconductor materials that can provide the semiconductor substrate 1 may include indium aluminum arsenide (InAlAs), indium gallium arsenide (InGaAs), gallium arsenide (GaAs), gallium phosphide (GaP), indium antimonide (InSb), indium arsenide (InAs), indium nitride (InN), indium phosphide (InP), aluminum gallium arsenide (AlGaAs), indium gallium phosphide (InGaP), aluminum indium arsenide (AlInAs), aluminum indium antimonide (AlInSb), gallium arsenide nitride (GaAsN), and combinations thereof.

In some embodiments, an insulator layer or buried oxide layer 2, such as a buried oxide layer composed of silicon oxide (SiO2), may be present over the semiconductor substrate 1. The buried oxide layer 2 may be formed on the base semiconductor substrate 1 using a deposition method, such as chemical vapor deposition, e.g., plasma enhanced chemical vapor deposition (PECVD), or may be formed using a thermal growth process, e.g., thermal oxidation. The buried oxide layer 2 may have a thickness ranging from 20 to 500 nm.

In order to ensure the proper lattice formation for the dual base region, the substrate structure depicted in FIG. 2 may be formed using suitable wafer bonding methods known in the art and/or can otherwise be provided as a starting structure utilizing suitable manufacturing techniques known in the art. The substrate structure may include a material stack that includes the base semiconductor substrate 1 and the insulator or buried oxide layer 2 present on the semiconductor substrate 1. As stated in the preceding paragraph, the insulator or buried oxide layer 2 may be formed on the base semiconductor substrate 1 using a deposition method, such as chemical vapor deposition, e.g., plasma enhanced chemical vapor deposition (PECVD). The semiconductor material layer 3' can be any suitable type III-V material, including but not limited to can be any suitable type III-V material, including but not limited to phosphide (InP) or indium phosphide (InP) on silicon (Si), aluminum arsenide (InAlAs), indium gallium arsenide (InGaAs), gallium arsenide (GaAs), gallium phosphide (GaP), indium antimonide (InSb), indium arsenide (InAs), indium nitride (InN), indium phosphide (InP), aluminum gallium arsenide (AlGaAs), indium gallium phosphide (InGaP), aluminum indium arsenide (AlInAs), aluminum indium antimonide (AlInSb), and gallium arsenide nitride (GaAsN). Because the semiconductor material layer 3' is processed to provide the first base layer 3' of the dual base region of the LBJT device, the semiconductor material layer 3' is doped to an n-type or p-type conductivity depending upon whether the LBJT device is a PNP or an NPN device. The dopant that dictates the conductivity type semiconductor material layer 3' may be introduced using ion implantation or in situ doping. The term "in situ" denotes that the dopant that dictates the conductivity type of a material is introduced while the material is being formed, e.g., during an epitaxial growth process.

Figure 3:
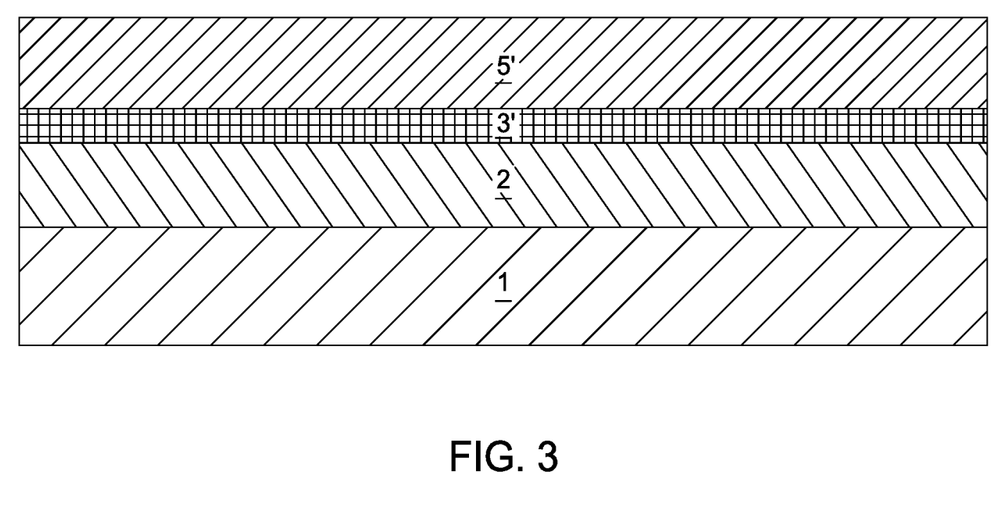
FIG. 3 is a side cross-sectional view depicting one embodiment of a substrate structure that may be used to form an LBJT with a dual base region, where the LBJT device includes a material stack of a type IV or type III-V semiconductor material for forming a second base layer, a first base layer, a buried oxide or insulator layer and a base supporting substrate, in accordance with one embodiment of the present disclosure.

FIG. 3 depicts one embodiment for forming a semiconductor material layer 5' for a second base layer 5. The semiconductor material layer 5' is formed over the semiconductor material 3' using an epitaxial growth process and can include a type III-V semiconductor material or a type IV semiconductor material. Exemplary group IV and III-V semiconductor materials that can be used in the creation of the semiconductor material 5' include, but are not limited to silicon (Si) germanium (Ge), gallium arsenide (GaAs), indium phosphide (InP) and indium gallium arsenide (InGaAs). Such processes include metalorganic chemical vapor deposition (MOCVD) and molecular beam epitaxy (MBE). In some embodiments, compounds could be grown directly over the substrate with, and depending on the material to be grown, one or more precursors can be used. If a type III-V material is grown over the substrate, then at least two precursors can be used, one for each of the type III and type V material. Depending on which III-V material(s) is to be grown and which precursor is used, different parameters (temperature, process pressure, times, etc.) are applicable. Metalorganic precursors include Trimethylgallium, Trimethylaluminum, Trimethylindium, Trimethylantimony, Tertiarybutylarsine and Tertiarybutylphosphine. Alternate Group V precursors include arsine and phosphine. If the semiconductor material layer 5' is to include a type IV material in lieu of a type III-V material, then a type IV source gas can be used. For example, if a germanium type IV material is preferred, source gases include germane, digermane, halogermane, dichlorogermane, trichlorogermane, tetrachlorogermane, and combinations thereof.

In one embodiment, the material that comprises the first base layer 3 and the second base layer 5, i.e. semiconductor material layer 3' and semiconductor layer 5', is selected such that the there is a substantial lattice match between the layers and such that the first base layer 3 has a wider band gap than the second base layer 5.

The source gas used in the epitaxial deposition process can include at least one precursor gas and a carrier gas, such as, for example hydrogen. The growth temperature in the chamber may range from 250 degrees Celsius to 900 degrees Celsius. The growth system may also utilize low-energy plasma to enhance the layer growth kinetics. The epitaxial growth system may be a single-wafer or multiple-wafer batch reactor. Depending on which source is used, process temperature, gas flow, pressure and times can vary significantly.

Other epitaxial deposition techniques can be used to develop the semiconductor material layer 5', and the above are merely provided as an illustration.

Figure 4:
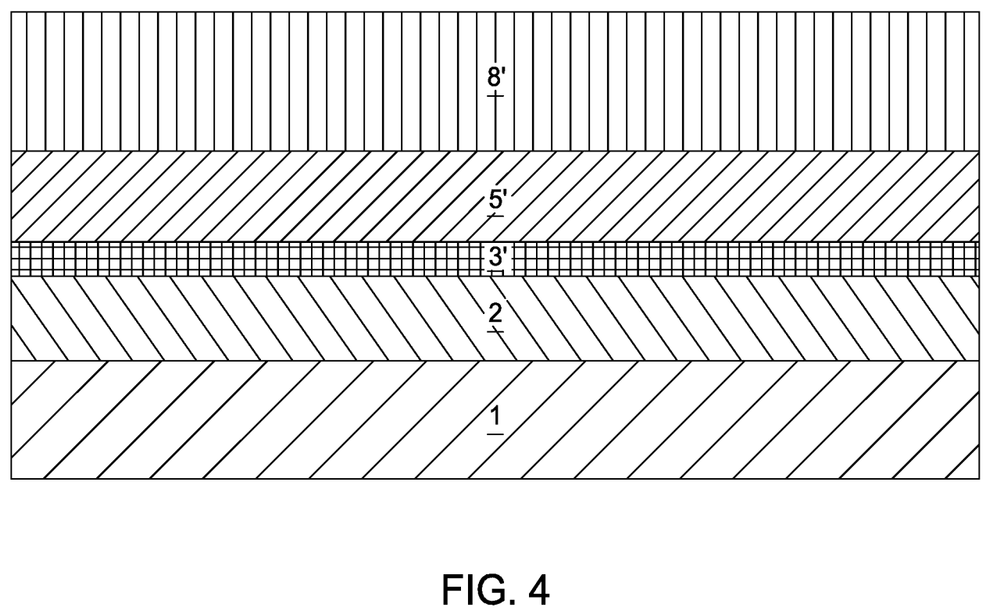
FIG. 4 is a side cross-sectional view depicting forming a material layer for an extrinsic base region of the LBJT device on the substrate depicted in FIG. 3, in accordance with one embodiment of the present disclosure.

FIG. 4 depicts one embodiment of forming a semiconductor material layer 8' for an extrinsic base layer 8 of the LBJT device on the substrate depicted in FIG. 2, where, as stated above, the extrinsic base layer 8 may be composed of type III-V or type IV material, including a single crystalline type III-V material, silicon or germanium containing semiconductor material, such as silicon, single crystal silicon, polycrystalline silicon, polycrystalline germanium, polycrystalline silicon germanium, single crystal germanium, single crystal silicon germanium and combinations thereof. The semiconductor material layer 8' for an extrinsic base layer 8 is typically formed atop the semiconductor material layer 5'. The semiconductor material layer 8' for the extrinsic base region 8 may be formed using chemical vapor deposition (CVD). Variations of CVD processes suitable for this stage of the process flow disclosed herein may include, but is not limited to, Atmospheric Pressure CVD (APCVD), Low Pressure CVD (LPCVD), Plasma Enhanced CVD (PECVD), Metal-Organic CVD (MOCVD) and combinations thereof. The semiconductor material layer 8' for an extrinsic base region 8 of the LBJT device is typically doped to the same conductivity type as the semiconductor material layer 3' and the semiconductor material layer 5' that provides the first base layer 3 and the second base layer 5, but the concentration of the n-type or p-type dopant that is present in the semiconductor material layer 8' for an extrinsic base region 8 is typically greater than the dopant concentration of the n-type or p-type dopant in the semiconductor material layer 5' and semiconductor material layer 3'. In one example, when the concentration of the n-type or p-type dopant in the dual base region, which includes the first base layer 3 and the second base layer 5, ranges from 1×1017 atoms/cm3 to 3×1019 atoms/cm3, the concentration of the n-type or p-type dopant in semiconductor material layer 8' for an extrinsic base layer 8 may range from 1×1019 atoms/cm3 to 5×1021 atoms/cm3. In another example, when the concentration of the n-type or p-type dopant in the dual base region ranges from 1×1018 atoms/cm3 to 5×1018 atoms/cm3, the concentration of the n-type or p-type dopant in the semiconductor material layer 8' for an extrinsic base region 8 may range from 1×1020 atoms/cm3 to 1×1021 atoms/cm3. The dopant may be implanted in situ, by ion implantation, or by gas phase doping. The thickness for the material layer 8' for an extrinsic base region 8 of the LBJT device may range from 10 nm to 1000 nm.

Figure 5:
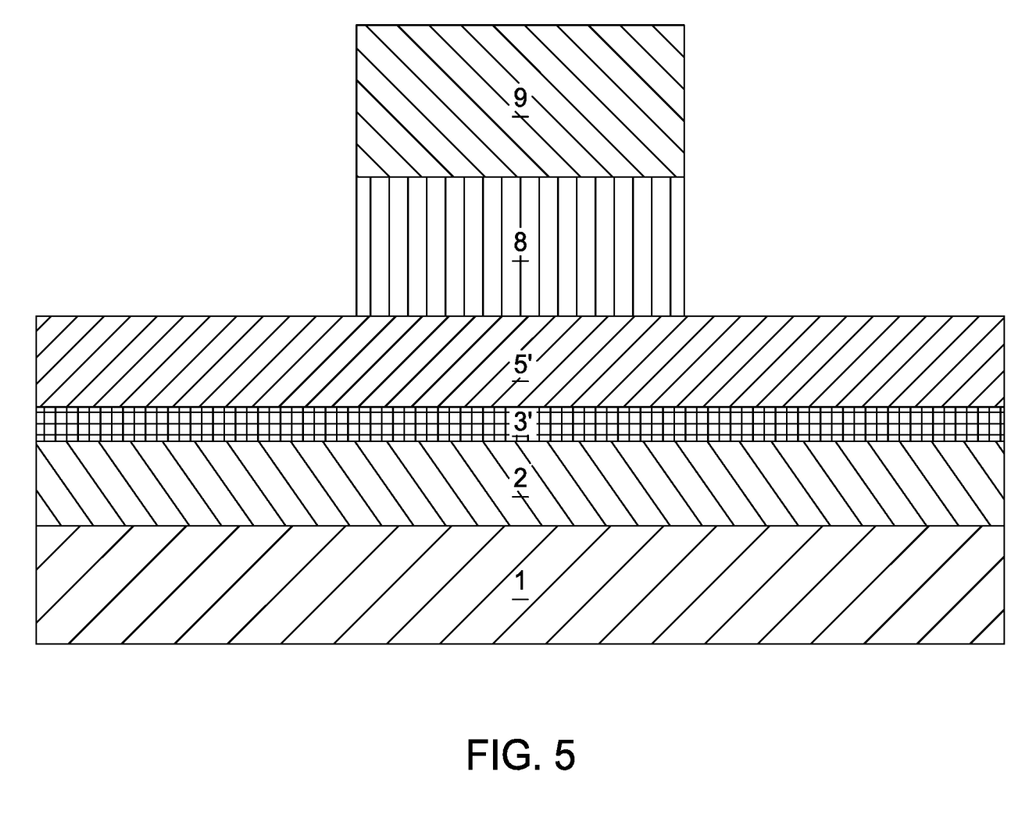
FIG. 5 is a side cross-sectional view depicting forming a hardmask on the material layer for the extrinsic base layer of the LBJT device, and patterning the material layer for the extrinsic base layer of the LBJT device, in accordance with one embodiment of the present disclosure.

FIG. 5 depicts one embodiment of forming a hardmask 9 on the semiconductor material layer 8' for the extrinsic base layer 8 of the LBJT device, and patterning the semiconductor material layer 8' to provide the extrinsic base region 8 of the LBJT device. Forming a hardmask 9 may begin with depositing a dielectric layer on the upper surface of the semiconductor material layer 8' for the extrinsic base region 8. The dielectric layer that provides the hardmask 9 may be composed of an oxide, nitride, oxynitride, metal oxide or combination thereof. For example, when the hardmask 9 is composed of a nitride, the nitride may be provided by silicon nitride, the material layer for the hardmask 9 may be blanket deposited using chemical vapor deposition, e.g., plasma enhanced chemical vapor deposition (PECVD). The dielectric layer may then be patterned using photolithography and etch process, which can begin with forming a photoresist block mask. A photoresist block mask can be produced by applying a photoresist layer, exposing the photoresist layer to a pattern of radiation, and then developing the pattern into the photoresist layer utilizing conventional resist developer. The portions of the dielectric layer that are protected by the photoresist block mask remain to provide the hardmask 9, and the portions of the dielectric layer that are not protected by the photoresist block mask are removed by an etch process. The etch process for removing the exposed portions of the dielectric layer in patterning the hardmask 9 may be an anisotropic etch, such as reactive ion etch or laser etch, or an isotropic etch, such as a wet chemical etch.

Referring to FIG. 5, and following formation of the hard mask 9, the exposed portions of the semiconductor material layer 8' for the extrinsic base layer 8 may be etched, i.e., removed, to expose an upper surface of the semiconductor material layer 5' for the second base region 5 (as depicted below with respect to FIG. 6). In one embodiment, the etch process for etching the semiconductor material layer 8' for the extrinsic base region 8 may be an anisotropic etch. An "anisotropic etch process" denotes a material removal process in which the etch rate in the direction normal to the surface to be etched is greater than in the direction parallel to the surface to be etched. One form of anisotropic etching that is suitable for etching the material layer 8' for the extrinsic base region 8 is reactive ion etching (RIE). The etch process may be timed until the upper surface of the semiconductor material layer 5' for the second base layer 5 is exposed.

Figure 6:
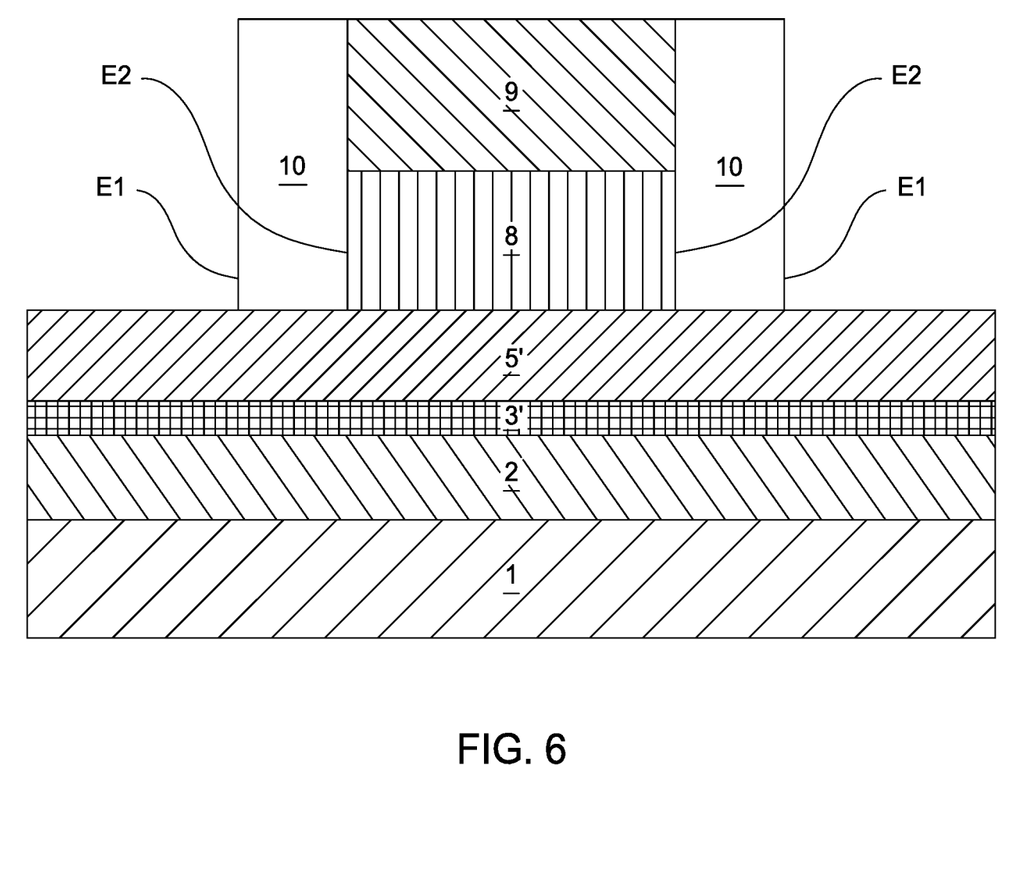
FIG. 6 is a side cross-sectional view depicting forming a spacer on the extrinsic base region, in accordance with one embodiment of the present disclosure.

FIG. 6 depicts one embodiment of forming a spacer(s) 10 on the sidewalls of the extrinsic base layer 8. The spacer 10 may include a dielectric material such as silicon oxide, silicon nitride, silicon oxynitride, boron or nitrogen containing SiN, or SiON (like SiBCN or SiOCN) or a combination thereof. The spacer 10 can be formed, for example, by conformal deposition of a dielectric material layer and subsequent anisotropic etch that removes the horizontal portions of the deposited dielectric material layer. The term "conformal layer" denotes a layer having a thickness that does not deviate from greater than or less than 30% of an average value for the thickness of the layer. The conformal deposition can be performed, for example, by chemical vapor deposition (CVD), atomic layer deposition (ALD), or a combination thereof. The etch process may be reactive ion etching (RIE) or laser etching.

Figure 7:
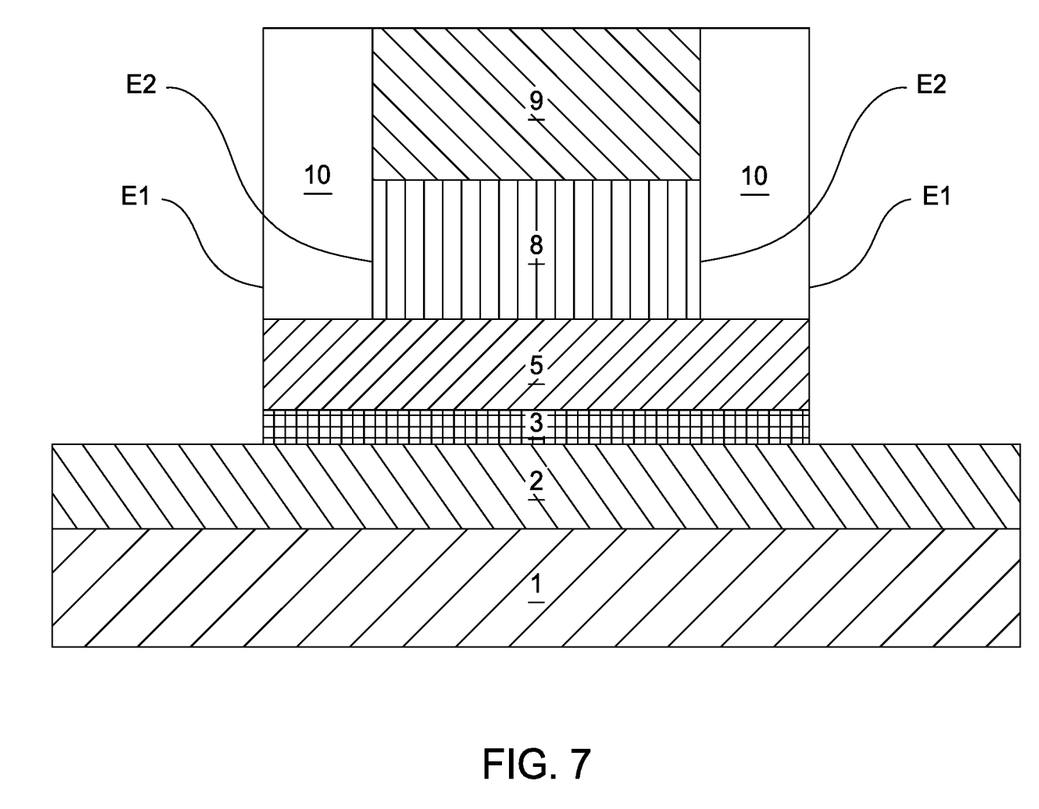
FIG. 7 is a side cross-sectional view depicted etching the first base layer and the second base layer, where the etch stops on the insulator or buried oxide layer, in accordance with one embodiment of the present disclosure.

FIG. 7 depicts selectively, with respect to the buried oxide or insulator layer 2, etching the semiconductor material layer 3' and the semiconductor material layer 5' for providing a first base layer 3 and a second base layer 5, respectively, to the buried oxide or insulator layer 2 of the LBJT device. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater.

The etch process depicted in FIG. 7 patterns the first base region 3 and the second base region 5 semiconductor material 3' and the semiconductor material 5', respectively. The exposed portions of the semiconductor material layer 3' and the semiconductor material layer 5' may be removed while the portions of the semiconductor material layer 3' and the semiconductor material layer 5' underlying the spacer 10, and the hardmask 9 are protected from being removed by the etch. The etch process for removing the exposed portions of the semiconductor material layer 3' and the semiconductor material layer 5' may be a dry etch, such as reactive ion etch. The etch process for etching the semiconductor material layer 3' and the semiconductor material layer 5' may be selective to the dielectric spacer 10, the hardmask 9 and the underlying buried oxide or insulator layer 2.

Figure 8:
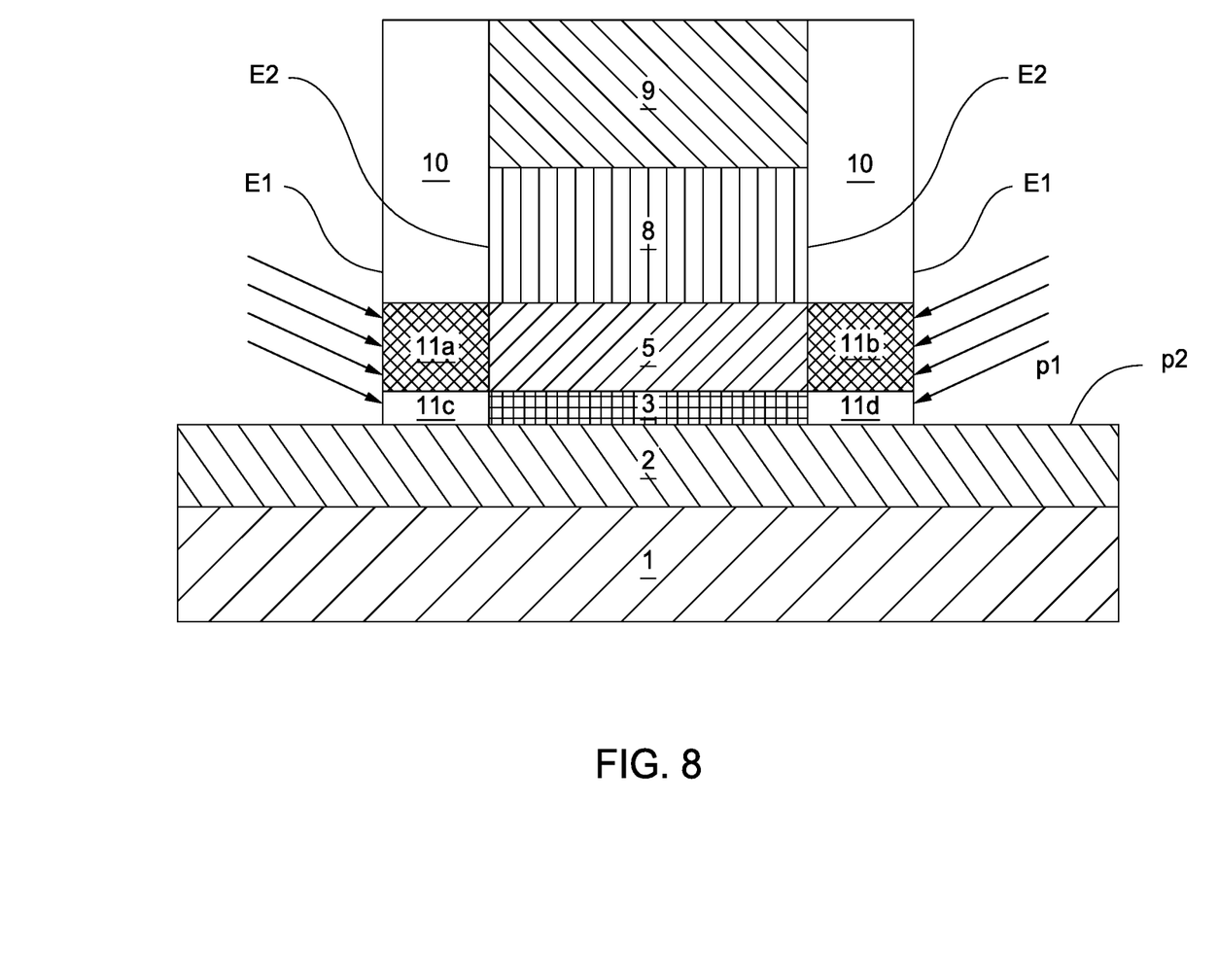
FIG. 8 is a side cross-sectional view depicting one embodiment of forming emitter and collector extension regions, i.e., junctions, on opposing sides of the dual base region, in accordance with one embodiment of the present disclosure.

FIG. 8 depicts one embodiment of forming emitter and collector extension regions 11a, 11b, 11c, and 11d e.g., abrupt extension regions 11a, 11b, 11c, and 11d on opposing sides of the dual base region. The emitter and collector extension regions 11a, 11b, 11c, and 11d i.e., the emitter and collector p-n junctions with the dual base region, may be formed using an angled ion implant and an anneal process. The extension regions 11a, 11b, 11c and 11d are doped to a conductivity type that is opposite the conductivity type of the dual base region. For example, if the dual base region has an n-type conductivity, the extension regions 11a, 11b, 11c, and 11d are doped to a p-type conductivity. In another example, if the dual base region has a p-type conductivity, the extension regions 11a, 11b, 11c and 11d are doped to an n-type conductivity.

The term "p-type" refers to the addition of impurities to an intrinsic semiconductor that creates deficiencies of valence electrons. As used herein, "n-type" refers to the addition of impurities that contributes free electrons to an intrinsic semiconductor. In the embodiments, in which the first base layer 3 and the second base layer 5 of the dual base region are of a type III-V the dopant may be an element from Group IV or VI of the Periodic Table of Elements. To provide a p-type dopant to the III-V semiconductor material, the dopant may be an element from Group II or VI of the Periodic Table of Elements. In an III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities. In some examples, to provide abrupt junctions in a base region 5 composed of a type III-V semiconductor material, the dopants that dictate the n-type or p-type conductivity may include selenium (Se), tellurium (Te), Zinc (Zn), Magnesium (Mg). silicon (Si), germanium (Ge) and a combination thereof.

The dopants for the emitter and collector extension regions 11a, 11b, 11c, and 11d, e.g., abrupt extension regions 11a, 11b, 11c and 11d are introduced by angled ion implantation, and extend beneath the outside edge E1 of the spacer 10, but not extend in a significant amount, i.e., concentration, beyond the outside edge E2 of the spacer 10.

Angled ion implantation as used throughout the instant application denotes that dopants are implanted towards the surface of the exposed sidewall surface of first base layer 3 and the second base layer 5 along a plane P1 that forms an acute angle $\alpha$ when intersecting with the plane P2 that is substantially parallel to the upper surface of the crystalline oxide layer 2. The angled ion implantation may include an angle $\alpha$ ranging from 3° to 75°. In another embodiment, the angled ion implantation includes an angle $\alpha$ ranging from 5° to 60°. In yet another embodiment, the angled ion implantation includes an angle $\alpha$ ranging from 15° to 45°.

Following the angled ion implantation, the structure may be annealed with a low temperature junction anneal. The anneal may be conducted by furnace, rapid thermal anneal (RTA) or laser anneal. The temperature of the anneal process may range from 400° C. to 600° C., in which the time and temperature of the anneal is selected to avoid excess diffusion of the dopant from the extension regions 11 with the base region 5, so as to maintain the abrupt characterization of the dopant distribution in the extension regions 11.

Figure 9:
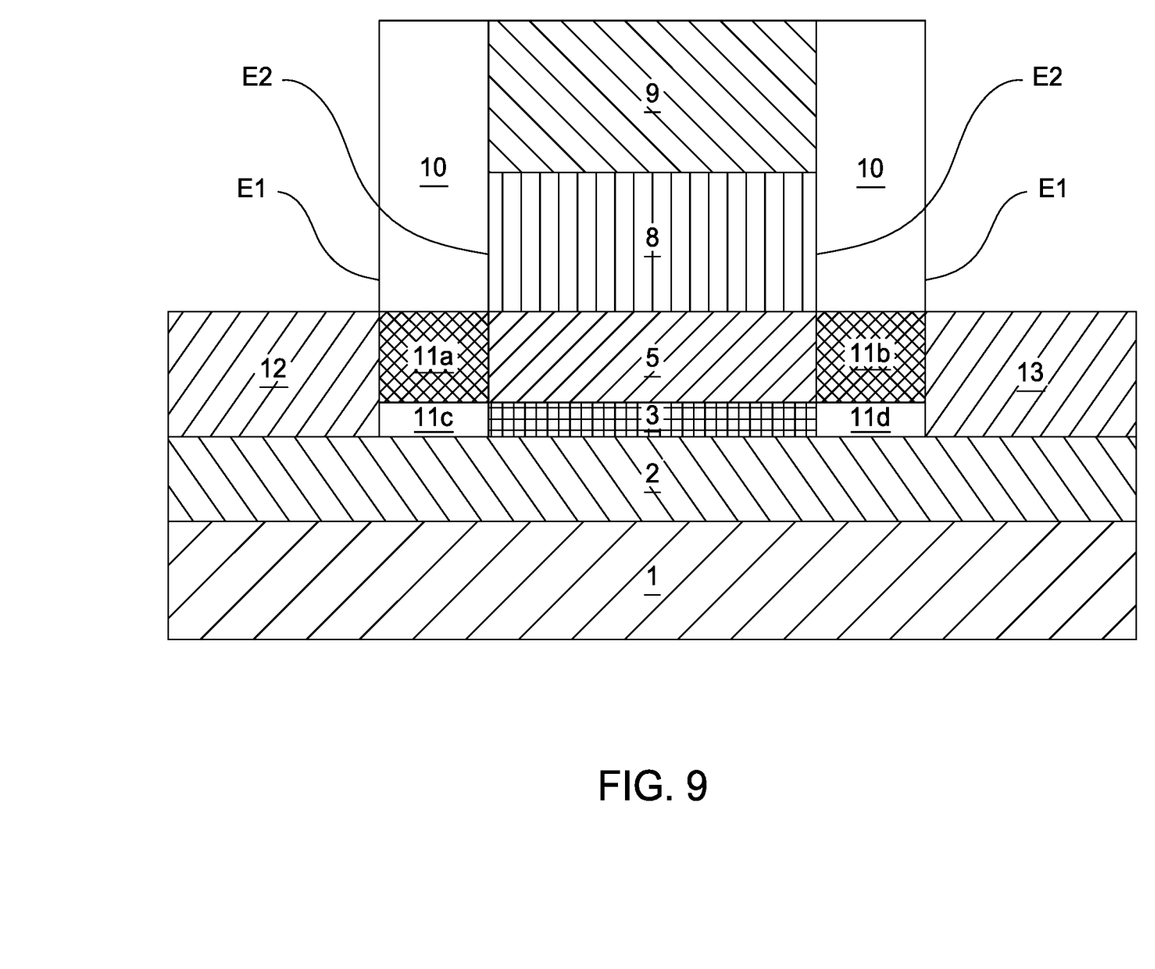
FIG. 9 is a side-cross section view depicting formation of emitter and collector regions on the structure of FIG. 8.

FIG. 9 illustrates a following process step, according to one embodiment, for forming the emitter and collector regions 12, 13 of the LBJT device. The emitter and collector regions 12, 13 are formed by epitaxial growth process. The emitter and collector regions 12, 13 can be composed of polycrystalline or single crystalline semiconductor material having a larger band gap than the layers of the dual base region. The term "single crystalline" denotes a crystalline solid, in which the crystal lattice of the entire sample is substantially continuous and substantially unbroken to the edges of the sample, with substantially no grain boundaries. Contrary to a single crystal crystalline structure, a polycrystalline structure is a form of semiconductor material made up of randomly oriented crystallites and containing large-angle grain boundaries, twin boundaries or both. Multi-crystalline is widely referred to a polycrystalline material with large grains (of the order of millimeters to centimeters). Other terms used are large-grain polycrystalline, or large-grain multi-crystalline. The term polycrystalline typically refers to small grains (hundreds of nanometers, to hundreds of microns).

The single crystalline or polycrystalline semiconductor material that provides the emitter region 12 and the collector region 13 may be a type IV semiconductor material or a type III-V semiconductor material as specified above for the first base layer 3 and the second base layer 5. Typically, in some embodiments, when the base region is composed of a III-V semiconductor material, the emitter region 12 and collector region 13 are also composed of a III-V semiconductor material, and the band gap of the emitter and collector region 12, 13 can be equal to or larger than the band gap of the first base layer 3 and the second base layer 5. The composition of the semiconductor material that provides the emitter region 12 and the collector region 13 may be selected to have a band gap that is equal to or greater than the first base layer 3 or the second base layer 5.

The polycrystalline or single crystalline semiconductor material is grown, e.g., by lateral epitaxial growth via one or both of the first base layer 3 and the second base layer 5.

A number of different sources may be used for the deposition of the semiconductor material for the emitter and collector region 12, 13. In some embodiments, in which the second base layer 5 is comprised of a type IV material, such as germanium, the emitter and collector region can be composed of germanium, the germanium gas source may be selected from the group consisting of germane (GeH4), digermane (Ge2H6), halogermane, dichlorogermane, trichlorogermane, tetrachlorogermane and combinations thereof. In embodiments where one or both of the first base layer 3 and the second base layer 5 include a III-V material, the precursor and source gases may be as those described for the first base layer 3 and the second base layer 5.

In some embodiments, the deposition process for forming the semiconductor material of the emitter and collector regions 12, 13 may continue until the thickness of the deposited material extends above the upper surface of the dual base region. The emitter and collector regions 12, 13 are doped with a conductivity type dopant that is opposite the conductivity type of the dual base region. The emitter and collector regions 12, 13 are doped with a conductivity type dopant that is the same conductivity type as the emitter and collector extension regions 11a, 11b, 11c, and 11d e.g., abrupt junctions 11a, 11b, 11c, and 11d. In one example, the dopant concentration of the emitter and collector regions 12, 13 may range from 5×1019 atoms/cm3 to 1×1021 atoms/cm3. In another example, the dopant concentration of the emitter and collector regions 12, 13 may range from 2×1019 atom s/cm3 to 5×1019 atoms/cm3.

In some embodiments, selective epitaxial growth of in-situ doped poly-silicon or poly-silicon germanium or III-V material for the emitter and collector regions 12, 13 may be facetted as depicted in FIG. 9 and FIG. 1, or the selective epitaxial growth of in-situ doped poly-silicon or poly-silicon germanium or III-V material for the emitter and collector regions 12, 13, may be non-facetted. By selective, it is meant that the epitaxial material growth on the exposed sidewall surface of the first base layer 3 or the second base layer 5, i.e., junctions 11a, 11b, 11c, and 11d and the insulator layer or buried oxide layer 2, but the epitaxial material will not be formed on the hardmask 9 and the dielectric spacers 10.

After forming the collector/emitter regions, and as a shown in FIG. 9 per one embodiment, any suitable and conventional etch technique can be employed to remove the hardmask 9, e.g. an etch technique that selectively removes the hardmask 9 in relation to the extrinsic base region 8 in order, pursuant to one embodiment, to provide the structure of FIG. 1.

Although not expressly shown, in one embodiment, in order to bring one type of a final and operable device intro fruition, an inter-level-dielectric material or layer (ILD) can be deposited over and fill the entire structure of FIG. 1. The dielectric material can be any suitable ILD material, e.g. silicon nitride or silicon oxide, and can be formed by a suitable deposition technique, e.g. CVD. The deposited ILD material can be planarized using CMP in relation to the top of the extrinsic base layer 8 to form a suitable final structure.

Having described preferred embodiments of vertical transistor fabrication and devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

What is claimed is:

1. A method for forming a lateral bipolar junction transistor (LBJT) device comprising:
   providing a III-V on insulator substrate that comprises an insulator layer and a III-V material layer;
   epitaxially forming a base material layer over the III-V material layer;
   forming emitter and collector extension regions on opposing sides of a second base material layer using ion implantation; and
   epitaxially forming an emitter region and a collector region in contact with the emitter and collector extension regions,
   wherein the III-V material layer has a wider band gap than the base material layer.

2. The method of claim 1 further comprising:
   forming an extrinsic base material layer over the base material layer;
   forming a hard mask on the extrinsic base material layer;
   etching the extrinsic base material layer selective to the base material layer and the hard mask to form an extrinsic base layer;
   forming a spacer on sidewalls of the extrinsic base layer; and
   forming a dual base region over the insulator layer.

3. The method of claim 2, wherein forming the dual base region comprises:
   etching i) the III-V material layer to pattern a first base layer with an etch that is selective to the hard mask and the spacer prior to forming the emitter and collector extension regions and ii) the base material layer to pattern a second base layer with an etch that is selective to the hard mask and the spacer prior to forming the emitter and collector extension regions.

4. The method of claim 3, wherein the extrinsic base material layer comprises doped polycrystalline silicon material, doped polycrystalline material, III-V material, and germanium.

5. The method of claim 3, wherein the first base layer and the second base layer have substantially similar lattice constants.

6. The method of claim 5, wherein forming the emitter and collector extension regions comprises:
   performing an angled ion implantation to produce an emitter and collector junction on opposing sides of the dual base region, wherein the dual base region includes both the first base layer and the second base layer.

7. The method according to claim 6, wherein the emitter region and the collector region comprise material that has a wider band gap than both the first base layer and the second base layer of the dual base region.

8. The method according to claim 7, wherein the base material layer and the extrinsic base material layer comprise III-V materials.

9. The method according to claim 8, wherein the base material layer, the III-V material layer, and the extrinsic base layer include a material selected from the group consisting of: indium phosphide (InP), indium aluminum arsenide (InAlAs), indium gallium arsenide (InGaAs), gallium arsenide (GaAs), gallium phosphide (GaP), indium antimonide (InSb), indium arsenide (InAs), indium nitride (InN), indium phosphide (InP), aluminum gallium arsenide (AlGaAs), indium gallium phosphide (InGaP), aluminum indium arsenide (AlInAs), aluminum indium antimonide (AlInSb), gallium arsenide nitride (GaAsN).

10. The method according to claim 9, wherein the emitter and collection regions both comprise a III-V material.

11. A method comprising:
providing a substrate that comprises an insulator layer and a III-V material layer;
forming a base material layer over the III-V material layer;
forming emitter and collector extension regions on opposing sides of a second base material layer; and
forming an emitter region and a collector region in contact with the emitter and collector extension regions,
wherein the emitter and collector regions and the emitter and collector extension regions form part of a bipolar junction transistor (BJT) device.

12. The method of claim 11 further comprising:
forming an extrinsic base material layer over the base material layer;
forming a hard mask on the extrinsic base material layer;
etching the extrinsic base material layer selective to the base material layer and the hard mask to form an extrinsic base layer;
forming a spacer on sidewalls of the extrinsic base layer; and
forming a dual base region over the insulator layer.

13. The method of claim 12, wherein forming the dual base region comprises:
etching i) the III-V material layer to pattern a first base layer with an etch that is selective to the hard mask and the spacer prior to forming the emitter and collector extension regions and ii) the base material layer to pattern a second base layer with an etch that is selective to the hard mask and the spacer prior to forming the emitter and collector extension regions.

14. The method of claim 13, wherein the extrinsic base material layer comprises doped polycrystalline silicon material, doped polycrystalline material, III-V material, and germanium.

15. The method of claim 13, wherein the first base layer and the second base layer have substantially similar lattice constants.

16. The method of claim 15, wherein forming the emitter and collector extension regions comprises:
performing an angled ion implantation to produce an emitter and collector junction on opposing sides of the dual base region, wherein the dual base region includes both the first base layer and the second base layer.

17. The method according to claim 16, wherein the emitter region and the collector region comprise material that has a wider band gap than both the first base layer and the second base layer of the dual base region.

18. The method according to claim 17, wherein the base material layer and the extrinsic base material layer comprise III-V materials.

19. The method according to claim 18, wherein the base material layer, the III-V material layer, and the extrinsic base layer include a material selected from the group consisting of: indium phosphide (InP), indium aluminum arsenide (InAlAs), indium gallium arsenide (InGaAs), gallium arsenide (GaAs), gallium phosphide (GaP), indium antimonide (InSb), indium arsenide (InAs), indium nitride (InN), indium phosphide (InP), aluminum gallium arsenide (AlGaAs), indium gallium phosphide (InGaP), aluminum indium arsenide (AlInAs), aluminum indium antimonide (AlInSb), gallium arsenide nitride (GaAsN).

20. The method according to claim 19, wherein the emitter and collection regions both comprise a III-V material.

* * * * *